United States Patent [19]
Brandenburg

[11] Patent Number: 5,770,477
[45] Date of Patent: Jun. 23, 1998

[54] FLIP CHIP-ON-FLIP CHIP MULTI-CHIP MODULE

[75] Inventor: Scott David Brandenburg, Kokomo, Ind.

[73] Assignee: Delco Electronics Corporation, Kokomo, Ind.

[21] Appl. No.: 798,457

[22] Filed: Feb. 10, 1997

[51] Int. Cl.⁶ .......................... H01L 21/44; H01L 21/48; H01L 21/50
[52] U.S. Cl. ...................... 438/108; 438/109; 438/613; 438/615
[58] Field of Search ................................. 438/108, 109, 438/613, 615, 343

[56] References Cited

U.S. PATENT DOCUMENTS 5,424,245   6/1995   Gurtler et al. ........................ 438/613

*Primary Examiner*—John Niebling
*Assistant Examiner*—David A. Zarneke
*Attorney, Agent, or Firm*—Jimmy L. Funke

[57] ABSTRACT

A multi-chip module that incorporates multiple flip chip (16) mounted on a daughter board (12), which in turn is flip-chip mounted onto a product mother board (10). The daughter board (12) is preferably a silicon substrate having solder bump terminals (14) and at least one conductor pattern on a surface thereof. The surface of the daughter board (12) may also have conductive runners and any passive electronic components required by the module. Mounted to the conductor pattern of the daughter board (12) are the flip chips (16) having solder bump terminals (18) that are registered and soldered to the conductor pattern of the daughter board (12). The solder bump terminals (14) of the daughter board (12) are then registered and soldered to a complementary conductor pattern on the mother board (10), such that the flip chips (16) are disposed between the daughter board (12) and the mother board (10).

7 Claims, 1 Drawing Sheet

FLIP CHIP-ON-FLIP CHIP MULTI-CHIP MODULE

FIELD OF THE INVENTION

The present invention generally relates to flip chip integrated circuit devices. More particularly, this invention relates to a multi-chip module that includes a silicon substrate to which one or more flip chips are mounted, with the silicon substrate also being flip-chip mounted to a mother board.

BACKGROUND OF THE INVENTION

A flip chip is generally a monolithic semiconductor device, such as an integrated circuit (IC), having bead-like terminals formed on one of its surfaces. The terminals, also referred to as solder bumps, serve to both secure the chip to a circuit board and electrically interconnect the flip chip circuitry to a conductor pattern formed on the circuit board, which may be a ceramic substrate, printed wiring board, flexible circuit, or a silicon substrate. Due to the numerous functions typically performed by the microcircuitry of a flip chip, a relatively large number of solder bumps are often required. The solder bumps are typically located at the perimeter of the flip chip on electrically conductive pads that are electrically interconnected with the circuitry on the flip chip. The size of a typical flip chip is generally on the order of a few millimeters per side, resulting in the solder bumps being crowded along the perimeter of the flip chip, with a typical solder bump pitch being about eight to ten mils (about 200 to about 250 micrometers). As a result, flip chip conductor patterns are typically composed of numerous individual conductors that are often spaced apart about one millimeter or less.

Flip chips are widely used in the electronics industry as a result of their compact size. While typically mounted directly to a substrate, flip chips have been incorporated into packages, an example of which is ball grid array (BGA) packages. BGA's typically have an IC chip that is wire bonded to a "daughter" circuit board with wires that are routed through the daughter board to terminals, or pads, on the opposite surface of the daughter board. Similar to the flip-chip process, the pads form a pad pattern and serve as interconnects between the IC chip and a conductor pattern on a mother board to which the BGA package is mounted. Where flip chips are used in a BGA package to form a multi-chip module, one or more flip chips are mounted to a high-density circuit board, which is then mounted within the BGA package, with interconnections made to the pad pattern of the package. Yet other prior art multi-chip modules have employed multiple flip chips that are mounted to a single circuit board or substrate, which is then wire bonded to a mother board.

While the above packaging techniques are able to capitalize on the processing and assembly advantages provided by flip chips, further improvements in packaging density are continuously sought.

SUMMARY OF THE INVENTION

It is an object of this invention to provide a multi-chip module that utilizes multiple flip chip devices.

It is another object of this invention that the multi-chip module includes flip chips that are mounted to a daughter board, which in turn is flip-chip mounted to a mother board.

It is a further object of this invention that the daughter board is a silicon substrate and that all interconnections of the module can be made by solder bumps.

The present invention provides a multi-chip module that incorporates multiple flip chip devices mounted on a daughter board, and more particularly a silicon substrate, which in turn is flip-chip mounted onto a product mother board. In this capacity, the daughter board can be used primarily for IC routing and providing passive circuit components, e.g., resistors and capacitor, for the module. The silicon technology made possible with the silicon daughter board enables high routing density and the use of a smaller substrate area. The result is a multi-chip module that provides greater size reduction than possible with prior art multi-chip modules, such as BGA packages that are typically many times larger than flip chips and therefore do not use board surface area as efficiently. In addition, the absence of wire bonding in the module is advantageous from the standpoint of processing and cost.

The multi-chip module of this invention generally includes a silicon substrate having solder bump terminals and at least one conductor pattern on a surface thereof. The surface of the silicon substrate may also have conductive runners and any passive electronic components required by the module. Notably, the silicon substrate can be completely devoid of active circuit components, e.g., transistors. Mounted to the conductor pattern of the silicon substrate is a flip chip device having solder bump terminals on a surface thereof, with the solder bump terminals of the flip chip device being registered and soldered to the conductor pattern of the silicon substrate. The solder bump terminals of the silicon substrate are then registered and soldered to a complementary conductor pattern of a mother board, such as a ceramic substrate, such that the flip chip device is disposed between the silicon substrate and the mother board.

From the above, it can be seen that the present invention provides an extremely small multi-chip module that does not require wirebonding technology or other relatively complicated processing. Notably, the routing density possible on the silicon substrate is higher than that possible with prior art multi-chip module configurations, such that the present invention provides for a multi-chip module of minimum size. Another advantage of this invention is that the multi-chip module enables the use of a relatively less expensive mother board.

Other objects and advantages of this invention will be better appreciated from the following detailed description.

BRIEF DESCRIPTION OF THE DRAWINGS

The present invention will now be described, by way of example, with reference to the accompanying drawings, in which.

DETAILED DESCRIPTION OF THE INVENTION

Figure 1:
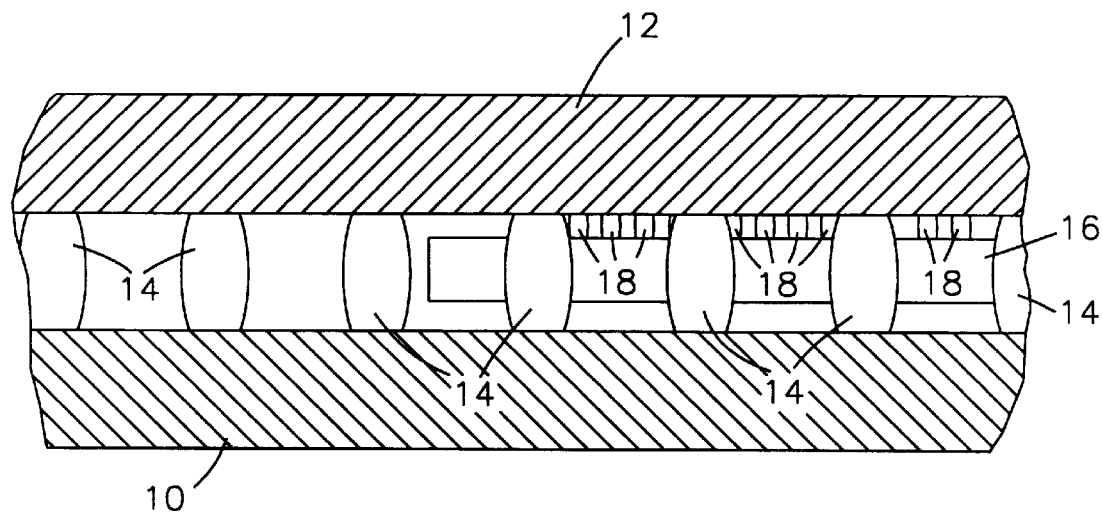
FIG. 1 is a fragmentary cross-sectional view of a flip-chip multi-chip module in accordance with this invention.
Figure 2:
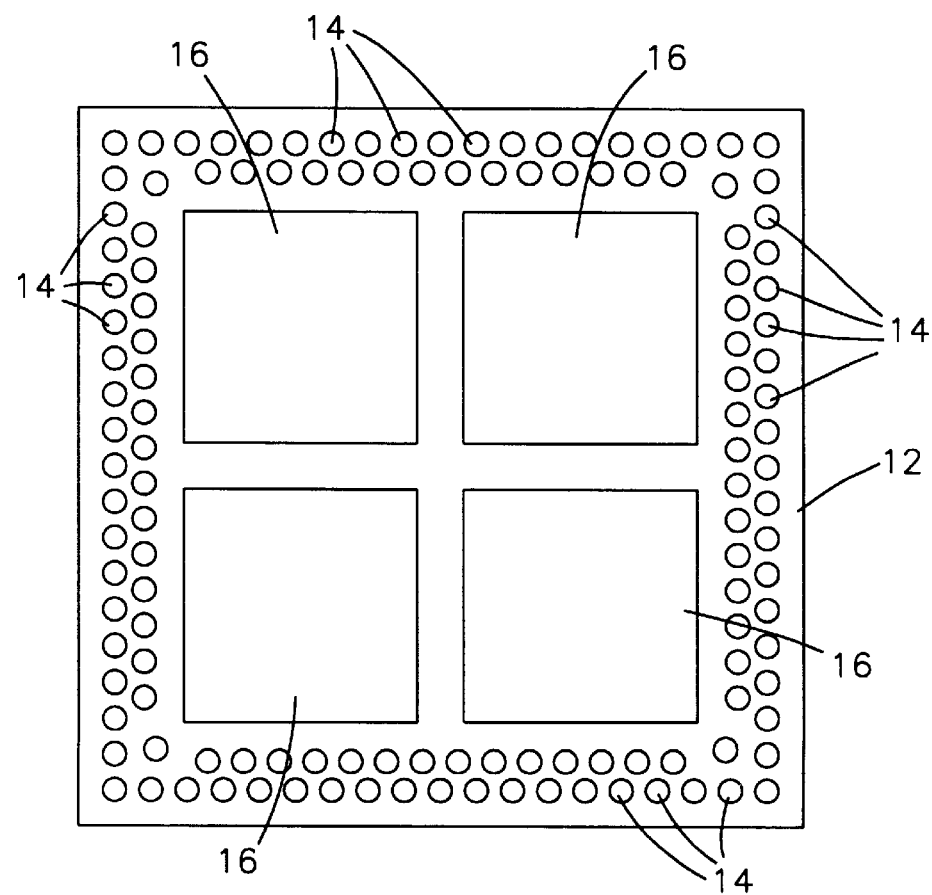
FIG. 2 is a plan view of the flip-chip multi-chip module of FIG. 1.

With reference to FIGS. 1 and 2, there is shown a flip-chip multi-chip module in accordance with this invention. As shown, the multi-chip module includes a daughter board 12 and one or more flip chips 16 that are flip-chip mounted to a surface thereof. In turn, the daughter board 12 is configured to be flip-chip mounted to a mother board 10 such that the flip chips 16 are between the mother and daughter boards 10 and 12, as shown in FIG. 1. The equipment and processing considerations for flip-chip mounting the flip chips 16 and the daughter board 12 would be understood by those skilled in the art, and therefore do not require discussion in any greater detail than that which follows.

As shown in FIG. 1, the daughter board 12 is reflow soldered to the mother board 10 with solder bumps 14 located along the perimeter of the board 12. In accordance with flip chip technology, the solder bumps 14 are registered and soldered to a complementary conductor pattern (not shown) on the mother board 10. The flip chips 16 are similarly mounted with solder bumps 18 to complementary conductor patterns (not shown) on an interior surface region of the daughter board 12. According to this invention, the daughter board 12 is a silicon substrate and the mother board 10 is preferably a ceramic material, such as alumina. As a result, negligible thermal cycle fatigue occurs in the solder bumps 14 as a result of differences in coefficients of thermal expansion between the boards 10 and 12. Alternatively, the mother board 10 could be a printed wiring board, flexible circuit or silicon substrate, as is known in the art.

As a silicon substrate, the daughter board 12 enables high routing density between the flip chips 16 and the mother board 10, so as to maximize the compactness of the module. For this purpose, conductor runners can be formed on the same surface of the daughter board 12 as the solder bumps 14. In addition, passive circuit components such as resistors and capacitors can be formed in or on this surface of the daughter board 12. Notably, the daughter board 12 can be completely devoid of active circuit components, e.g., transistors, which avoids the more complex processing required for such components.

According to this invention, the surface of the daughter board 12 opposite the solder bumps 14 can be metallized, such as by depositing a thin layer of gold on its surface, and formed with filtering components to provide protection from electromagnetic interference (EMI). As such, this invention advantageously eliminates the prior art requirement for external EMI filtering for a multi-chip module.

As is conventional for electronic applications, the solder bumps 14 and 18 are formed from solder alloys that can be reflowed at sufficiently low temperatures to avoid thermal damage to the flip chip circuitry. According to this invention, the composition for the solder bumps 14 is chosen on the basis of having a lower liquidus temperature than that of the solder bumps 18, such that the daughter board 12 can be reflow soldered to the mother board 10 at a temperature that will not reflow the solder bumps 18. For this purpose, the solder bumps 14 and 18 can be tin-lead alloys having relative tin and lead contents or additional alloying constituents to provide a higher liquidus temperature for the solder bumps 18. Suitable commercially available compositions for the solder bumps 14 include eutectic "BGA-type" solder balls, 90Pb-10Sn solder columns, cast eutectic tin leads and nickel columns, the latter three being noncollapsing materials with eutectic solder at each interface. The BGA-type solder balls are able to yield a solder bump height of about 10 to 24 mils (about 25 to 600 micrometers), while the noted solder columns and tin leads generally yield bump heights of about 30 to 90 mils and about 30 to 70 mils, respectively (about 0.8 to 2.3 and about 0.8 to 1.8 millimeters, respectively). In contrast, the higher-temperature solder bumps 18 preferably have a bump height of about 3 to about 4 mils (about 75 to about 100 micrometers), preferably about 3.5 mils (about 90 micrometers). As seen from FIG. 1, the solder bumps 14 must have sufficient height to accommodate the flip chips 16 and their solder bumps 18, while allowing for clearance between the flip chips 16 and the mother board 10.

The solder bumps 14 and 18 are generally formed directly on the daughter board 12 and flip chips 16 prior to registration with their respective conductor patterns. Suitable solder compositions for the bumps 14 and 18 can be screen printed or electrodeposited on contact pads provided on the daughter board 12 and flip chip 16, as is conventional. The solder is precisely deposited such that, after reflowing, each resulting solder bump 14 and 18 will accurately and uniquely mate with a corresponding conductor when the board 12 and chip 16 is registered with its corresponding conductor pattern. Due to the difference in solidus temperatures, the solder composition for the solder bumps 18 is preferably deposited and reflowed to form the solder bumps 18, which are then registered and reflowed to their conductor patterns to electrically and mechanically mount the flip chips 16 to the daughter board 12. Thereafter, the solder composition for the solder bumps 14 can be deposited and reflowed on the daughter board 12, which is then registered and reflow soldered to the mother board 10. Reflow can be achieved by any of a number of techniques well known in the art, and therefore will not be discussed in detail here. FIG. 1 is illustrative of the results of reflowing the solder bumps 14 and 18 in accordance with this invention.

While the invention has been described in terms of a preferred embodiment, it is apparent that other forms could be adopted by one skilled in the art. Accordingly, the scope of the invention is to be limited only by the following claims.

What is claimed is:

1. A method of forming a multi-chip module, the method comprising the steps of:

providing a mother board having a conductor pattern formed on a surface thereof;

providing a silicon substrate having solder bump terminals and multiple conductor patterns on a surface thereof;

providing multiple flip chip devices having solder bump terminals on a surface thereof;

registering and soldering the solder bump terminals of each flip chip device to each of the multiple conductor patterns of the silicon substrate, wherein each of the flip chip devices is disposed between the silicon substrate and the mother board; and then registering and soldering the solder bump terminals of the silicon substrate to the conductor pattern of the mother board;

wherein the flip chip devices are disposed between the silicon substrate and the mother board.

2. A method as recited in claim 1, wherein the solder bump terminals of the flip chip device have a higher liquidus temperature than the solder bump terminals of the silicon substrate, and the step of soldering the flip chip device to the silicon substrate entails a higher soldering temperature than the step of soldering the silicon substrate to the mother board.

3. A method as recited in claim 1, wherein the method further comprises the step of forming conductive runners on the surface of the silicon substrate.

4. A method as recited in claim 1, wherein the method further comprises the step of forming passive electrical components on the surface of the silicon substrate.

5. A method as recited in claim 1, wherein the silicon substrate is formed to be devoid of any active electronic components.

6. A method as recited in claim 1, wherein the mother board is formed of a ceramic material.

7. A method as recited in claim 1, further comprising the step of forming metallization and EMI filtering components on a second surface of the silicon substrate opposite the solder bump terminals.

* * * * *